(12) United States Patent
Buehler et al.

(10) Patent No.: US 8,507,854 B2
(45) Date of Patent: Aug. 13, 2013

(54) PARTICLE BEAM MICROSCOPY SYSTEM AND METHOD FOR OPERATING THE SAME

(75) Inventors: Wolfram Buehler, Hermaringen (DE); Holger Doemer, Bopfingen (DE); Matthias Lang, Moegglingen (DE); Joerg Stodolka, Aalen (DE); Peter Roediger, Vienna (AT); Emmerich Bertagnolli, Vienna (AT); Heinz Wanzenboeck, Vienna (AT)

(73) Assignee: Carl Zeiss Microscopy GmbH, Jena (DE)

( * ) Notice: Subject to any disclaimer, the term of this patent is extended or adjusted under 35 U.S.C. 154(b) by 175 days.

(21) Appl. No.: 12/804,139

(22) Filed: Jul. 13, 2010

(65) Prior Publication Data

US 2011/0079711 A1 Apr. 7, 2011

(30) Foreign Application Priority Data

Jul. 15, 2009 (DE) .......................... 10 2009 033 319

(51) Int. Cl.
*H01J 37/30* (2006.01)
(52) U.S. Cl.
CPC ...................................... *H01J 37/30* (2013.01)
USPC .......................................................... 250/306
(58) Field of Classification Search
USPC ................................................. 250/305–311
See application file for complete search history.

(56) References Cited

U.S. PATENT DOCUMENTS

| | | | |
|---|---|---|---|
| 4,660,297 A | 4/1987 | Danielson | |
| 5,510,624 A | 4/1996 | Zaluzec | |
| 6,098,637 A * | 8/2000 | Parke | 134/1.1 |
| 6,105,589 A | 8/2000 | Vane | |
| 6,452,315 B1 | 9/2002 | Vane | |
| 6,555,828 B1 | 4/2003 | Bokor et al. | |
| 6,610,257 B2 | 8/2003 | Vane | |
| 6,667,475 B1 * | 12/2003 | Parran et al. | 850/9 |
| 6,781,685 B2 | 8/2004 | Hamm | |
| 6,855,938 B2 | 2/2005 | Preikszas et al. | |
| 7,005,638 B2 * | 2/2006 | Spill | 250/306 |
| 7,038,364 B2 * | 5/2006 | Yamaguchi et al. | 313/231.01 |
| 7,375,328 B2 * | 5/2008 | Yonezawa et al. | 250/310 |
| 7,435,973 B2 | 10/2008 | Koops et al. | |

(Continued)

FOREIGN PATENT DOCUMENTS

| | | |
|---|---|---|
| DE | 102 08 043 | 9/2003 |
| DE | 10 2005 031 792 A1 | 1/2007 |

(Continued)

OTHER PUBLICATIONS

Office Action in German patent application No. 10 2009 033 319.3 dated Aug. 30, 2011 (with English-language translation).

(Continued)

*Primary Examiner* — Jack Berman
*Assistant Examiner* — Eliza Osenbaugh-Stewart
(74) *Attorney, Agent, or Firm* — Bruce D Riter

(57) ABSTRACT

A particle beam system 1 for cleaning itself comprises an irradiation system to direct electromagnetic radiation onto the surfaces to be cleaned and a supply system 61 to supply a precursor gas to the interior of the vacuum chamber 11 of the particle beam system 1. The precursor gas is activated in a vicinity of the surfaces to be cleaned and is converted into a reaction gas which reacts with the contaminants present on the irradiated surfaces such that said contaminants may be pumped out then.

24 Claims, 3 Drawing Sheets

(56) References Cited

U.S. PATENT DOCUMENTS

| | | | |
|---|---|---|---|
| 2002/0136674 | A1 | 9/2002 | Vane |
| 2003/0066975 | A1 | 4/2003 | Okada |
| 2004/0033425 | A1 | 2/2004 | Koops et al. |
| 2004/0195525 | A1 | 10/2004 | Spill |
| 2004/0227102 | A1 | 11/2004 | Kurt et al. |
| 2005/0103272 | A1 | 5/2005 | Koops et al. |
| 2005/0230621 | A1 | 10/2005 | Edinger et al. |
| 2006/0249078 | A1* | 11/2006 | Nowak et al. ............ 118/724 |
| 2006/0284090 | A1 | 12/2006 | Koops et al. |
| 2007/0132989 | A1 | 6/2007 | Kaller et al. |
| 2007/0284541 | A1 | 12/2007 | Vane |
| 2008/0212045 | A1 | 9/2008 | Bader |
| 2008/0230096 | A1* | 9/2008 | Kawamura et al. ............ 134/90 |
| 2009/0121132 | A1 | 5/2009 | Koops et al. |
| 2009/0314939 | A1 | 12/2009 | Stern et al. |

FOREIGN PATENT DOCUMENTS

| | | |
|---|---|---|
| DE | 10 2007 051 459 A1 | 5/2009 |
| EP | 1 220 038 A1 | 7/2002 |
| EP | 1 998 389 A1 | 12/2008 |
| JP | 61-068305 A | 4/1986 |
| JP | 2005-244015 A | 9/2005 |
| JP | 2008-085231 A | 4/2008 |
| WO | WO 98/40791 A1 | 9/1998 |
| WO | WO 03/071578 A2 | 8/2003 |
| WO | WO 2009/053476 A1 | 4/2009 |
| WO | WO 2009/059614 A1 | 5/2009 |
| WO | WO 2010/043398 A1 | 4/2010 |

OTHER PUBLICATIONS

Morgan, C.G., et al., "Comparing the effects of different gas mixtures and vacuum chamber geometries on the Evactron cleaning process", Microscopy and Microanalysis 14 (SUPPL. 2), 1280-1281 (2008).

Vane, R. "Immobilization and removal of hydrocarbon contamination using the Evactron decontaminator", Microscopy and Microanalysis 12 (SUPPL. 2), pp. 1662-1663 (2006).

Garcia, R., et al., "Monitoring contamination rate in an SEM equipped with an Evactron anticontamination device", Microscopy and Microanalysis 12 (SUPPL. 2), pp. 204-205 (2006).

Rolland, P., et al., "Improved carbon analysis with evactron plasma cleaning", Microscopy and Microanalysis 10 (SUPPL. 2), pp. 964-965 (2004).

Vane, R., et al., "A study of the effects of evactron plasma cleaning on X-ray windows", Microscopy and Microanalysis 10 (SUPPL. 2), pp. 966-967 (2004).

Moon, D.W., et al., "Ultraviolet-ozone jet cleaning process of organic surface contamination layers", Journal of Vacuum Science and Technology A: Vacuum, Surfaces and Films 17(1), pp. 150-154 (1999).

Tabe, M., UV ozone cleaning of silicon substrates in silicon molecular beam epitaxy, Applied Physics Letters 45(10), pp. 1073-1075 (1984).

Fukuzaki, S., et al., "Effect of ozone on the surface charge and cleanability of stainless steel", Biocontrol Science 6 (2), pp. 87-94 (2001).

Baumgärtner, H., et al., "Ozone Cleaning of the Si-SiO2 System", Appl.Phys. A 43 (3), pp. 223-226 (1987).

Strein, E.(L.), Allred, D., "Eliminating carbon contamination on oxidized Si surfaces using a VUV excimer lamp", Thin Solid Films, 517 (2008) 1011-1015.

Office Action in the parallel German application No. DE 10 2009 033 319.3 and the English translation thereof.

* cited by examiner

PARTICLE BEAM MICROSCOPY SYSTEM AND METHOD FOR OPERATING THE SAME

CROSS-REFERENCES TO RELATED APPLICATIONS

The present application claims priority of Patent Application No. 10 2009 033 319.3, filed Jul. 15, 2009 in Germany, entitled "PARTIKELSTRAHL-MIKROSKOPIESYSTEM UND VEFAHREN ZUM BETREIBEN DESSELBEN", the content of which is hereby incorporated by reference in its entirety.

FIELD OF THE INVENTION

The invention relates to a particle beam microscopy system and a method of operating the same. In a particle beam microscopy system, particles like electrons and ions are directed towards a sample for generating secondary particles there. The secondary particles emanated by the sample are detected to gain information about the microscopic structure of the sample.

BRIEF DESCRIPTION OF THE PRIOR ART

In conventional particle beam microscopy systems the particle beam is generated by a source of radiation disposed inside of a vacuum. The sample to be inspected is mounted onto a sample holder such that it is exposed to radiation generated by the source. Furthermore, a particle detector for detecting particles from the sample triggered by the particle beam is disposed inside of the vacuum chamber.

Typically, when operating in a vacuum, a residual gas contains gases which are also contained in ambient air. Hence, the residual gas typically contains the components nitrogen, oxygen, water vapor, carbon dioxide and small amounts of noble gases. However, contaminants accumulate in the vacuum chamber when operating the particle beam microscopy system. Such contaminants comprise in particular hydrocarbons, like greases and solvents, which reach the vacuum chamber because of the operation of vacuum pumps, and other substances which may be dragged into the vacuum chamber when the sample is changed or which may be emanated by components of the particle beam system or by the sample itself. Furthermore, process gases are led to the sample in some particle beam systems and are activated there by the particle beam. These process gases are used to deposit material onto the sample or to ablate material from the sample. A, related system is described in detail in U.S. Pat. No. 7,435,973. The materials introduced into the vacuum chamber during deposition and ablation processes may constitute contaminants in subsequent processes.

Contaminants may be deposited on the vacuum chamber wall, on the sample holder or on other components of the particle beam system, and even inside of a particle beam column of the particle beam system, such as on apertures of the particle beam column, and may form bonds there. During operation of the particle beam system, contaminants may further be separated from the components on which they were deposited and affect the inspection process.

It is therefore desired to provide for modifications in order to remove contaminants from a particle beam microscopy system.

In U.S. Pat. No. 6,105,589 a plasma generator is used for generating oxygen radicals which are supplied to the vacuum chamber in order to decompose there contaminants such that the decomposition products can be pumped out.

Experience has shown that these conventional systems do not satisfy the requirements on a cleaning efficiency in some cases.

Therefore it is an object of the present invention to propose a particle beam microscopy system and a method of operating the particle beam microscopy system, in which contaminants of at least one of a chamber wall, a sample holder, a sample or another component of the particle beam system can be removed with a comparatively high efficiency.

According to embodiments, a reaction gas as such having a decomposing effect on contaminants is not supplied to the vacuum chamber, but rather a precursor gas of the reaction gas is supplied to the vacuum chamber. The precursor gas is converted into the reaction gas within the vacuum chamber. The conversion of the precursor gas into the reaction gas may take place in an immediate vicinity of the component on which contaminants are present, wherein the conversion of the precursor gas into the reaction gas may be activated by irradiation with electromagnetic radiation.

Furthermore, contaminants adsorbed to a surface can be activated directly by irradiation without being affected by the reaction gas, or the bond of the contaminants to the wall can be loosened such that the contaminants can react with the reactive gas or can desorb more easily or more efficiently from the surface.

In the present application, components on which contaminants are deposited or to which contaminants are adsorbed and which can be irradiated by electromagnetic radiation to convert the precursor gas can be any component of the system. In particular, these components comprise: a wall of a vacuum chamber in which there is a sample holder or a sample disposed, the sample itself, the sample holder or a detector such as in particular an electron detector. In some embodiments, components of a particle beam column such as apertures or detectors disposed in the particle beam column are not irradiated. In other embodiments, the irradiated surfaces are metallic or electrically conducting surfaces.

According to embodiments, the precursor gas comprises oxygen ($O_2$) and the reaction gas generated from oxygen by irradiating with electromagnetic energy then comprises ozone ($O_3$) providing oxygen radicals to decompose the contaminants. The inventors discovered that the conventional system explained above is, among other reasons, disadvantageous because ozone and oxygen radicals are generated first and then these radicals are supplied to the vacuum chamber. Due to the short half-life time or the short mean free path of ozone in the atmosphere of the vacuum chamber, the ozone may not reach the components on which the contaminants are deposited with sufficient effectiveness or concentration. According to embodiments, the reaction gas is activated in an immediate vicinity of the components the contaminants are deposited on due to irradiation with electromagnetic energy such that the ozone is available with a comparatively augmented concentration for releasing its cleaning power.

According to embodiments, the electromagnetic radiation for activating the precursor gas is ultraviolet light such as light having wavelengths shorter than 300 nm and in particular light having wavelengths shorter than 200 nm.

According to embodiments, the precursor gas is supplied to the vacuum chamber in such a manner that it is there available in augmented concentration. In particular, a partial pressure of the precursor gas is adjusted to a greater value in the vacuum chamber as compared to its production during normal operation of the vacuum system when operating the microscope, for example. During operation of the microscope, in conventional systems there are typically pressures of less than $10^{-5}$ mbar produced in the vacuum chamber, although special devices allow for substantially higher pressures in the chamber. According to the described embodiment, the partial pressure of the precursor gas is comparably higher. In particular, the partial pressure is higher than 100 mbar and, according to another embodiment, the partial pressure may reach up to 2000 mbar or even up to 5000 mbar.

According to other embodiments, the precursor gas is supplied to the vacuum chamber such that the precursor gas has a higher concentration than other gases. Then, a total pressure is smaller than, for example, two times, in particular smaller than 1.5 times and in particular smaller than 1.2 times the partial pressure of the precursor gas.

According to embodiments, while directing electromagnetic radiation onto the components having contaminants, the precursor gas is supplied continuously. Accordingly, the vacuum chamber can be pumped out continuously. It is possible to adjust a desired partial pressure of precursor gas in the vacuum chamber by adjusting the amount of reaction gas supplied per unit time, and the pumping capacity of a pumping system. This method is advantageous in the sense that, on the one hand, a high concentration of reaction gas can also be present in a vicinity of the components where contaminants may exist, and on the other hand, other products of decomposition of the contaminant are purged continuously out of the chamber.

According to other embodiments, the reaction gas is supplied to the vacuum chamber and an exposure to electromagnetic radiation is carried out in intervals, and then the vacuum chamber is evacuated to lower gas pressure to remove products of decomposition from the vacuum chamber. Then the pumping capacity of the vacuum system is reduced and the pressure of the reaction gas in the vacuum chamber is again adjusted to a higher value and another exposure to ultraviolet light is carried out.

According to embodiments, the electromagnetic radiation is generated by one or several sources of radiation, which are disposed inside of the vacuum chamber. The source of radiation may comprise a mercury vapor lamp.

According to other embodiments, the source of radiation is disposed outside of the vacuum chamber and the radiation generated by the source of radiation is directed into the interior of the vacuum chamber such that the radiation is directed to components at which contaminants may exist. In this case the vacuum chamber may comprise a window. Furthermore, mirrors and/or light guides can be used to direct the light onto desired surfaces of these components.

According to embodiments, the electromagnetic radiation impinges onto significant regions of the components at which contaminants may exist. In particular, the illuminated regions may have extensions of more than 1 cm$^2$, of more than 10 cm$^2$, of more than 50 cm$^2$ and also of more than 200 cm$^2$.

DESCRIPTION OF EMBODIMENTS OF THE INVENTION

The foregoing as well as other advantageous features will be more apparent from the following detailed description of exemplary embodiments with reference to the accompanying drawings. It is noted that not all possible embodiments necessarily exhibit each and every, or any, of the advantages identified herein.

Figure 1:
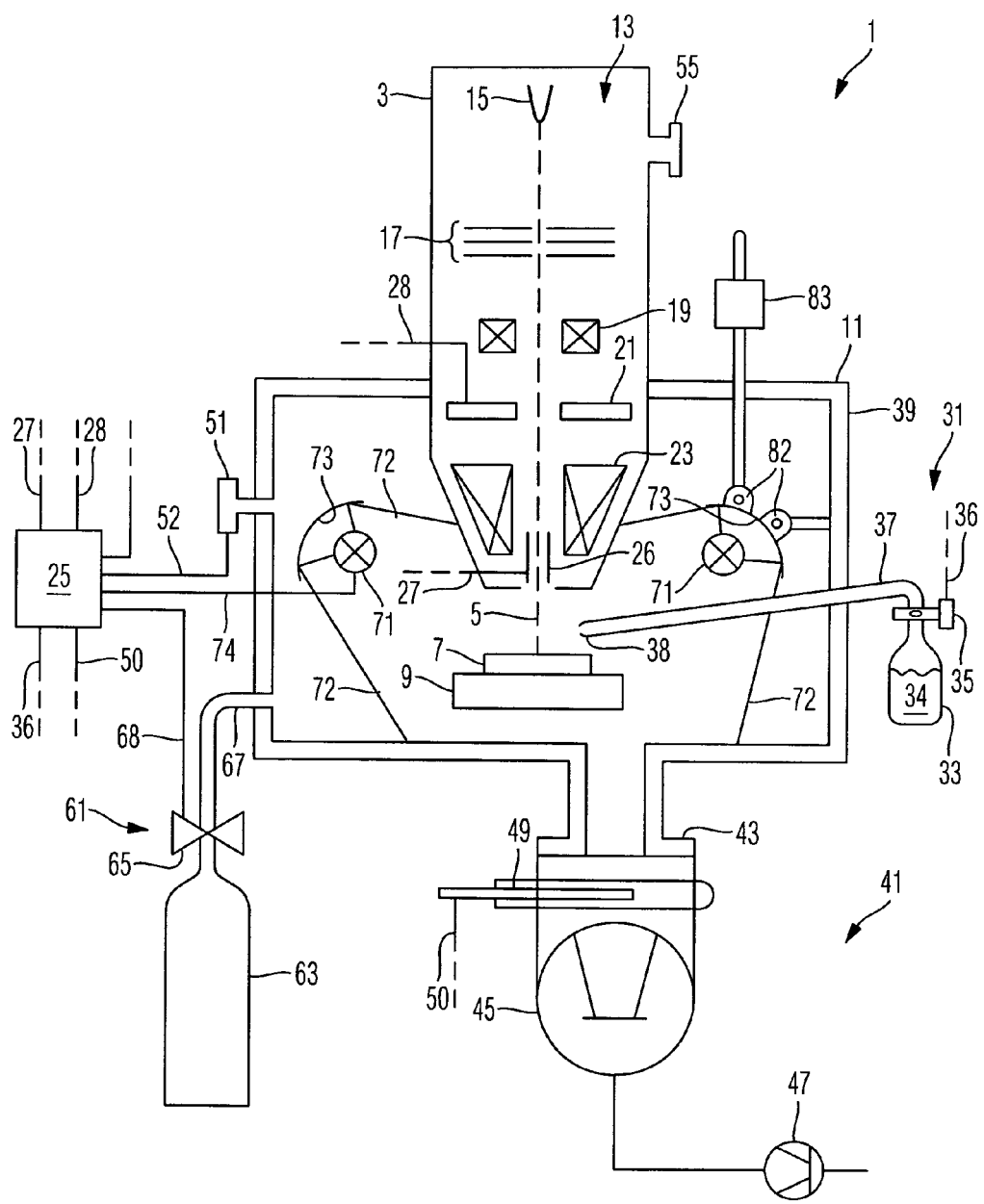
FIG. 1 shows a particle beam microscopy system according to a first embodiment.

In the exemplary embodiments described below, components that are alike in function and structure are designated as far as possible by like reference numerals. Therefore, to understand the features of the individual components of a specific embodiment, the descriptions of other embodiments and of the summary of the invention should be referred to.

FIG. 1 shows a schematic representation of a particle beam microscopy system 1 according to an embodiment. The microscopy system 1 comprises a particle beam column 3 for generating a particle beam 5, which can be directed onto a sample 7 mounted to a sample holder 9 which in turn is disposed inside of a vacuum chamber 11. The particle beam 5 represents an electron beam in the described embodiment. The particle beam 5 may represent an ion beam in an alternative embodiment.

The particle beam column 3 comprises an electron source 13 having a cathode 15 and suppression electrodes, extraction electrodes and anode electrodes 17 in order to generate the electron beam 5. The electron beam 5 traverses a condenser lens 19, a recess in a secondary electron detector 21 and an objective lens 23 until the electron beam 5 leaves the particle beam column 3 and impinges onto a surface of the sample 7 which is disposed at a certain distance away from the lower end of the particle beam column 3. A controller 25 controls the generation of the electron beam 5 and controls beam deflectors 26 via a control line 27 in order to direct the electron beam 5 onto selectable regions on the surface of the sample 7. The particle beam 5 impinging onto the sample 7 releases there electrons. Some of these secondary electrons enter the objective lens 23 and impinge onto the secondary electron detector 21. Detection signals of the detector 21 are transferred to the controller 25 via a data line 28. The controller may scan the beam 5 systematically across the surface of the sample 7 by controlling beam deflectors 26 and may detect detection signals corresponding to regions where the sample is scanned in order to obtain an electron microscopic image of the sample 7 from the detected signals.

In the embodiment described here, the secondary electron detector is disposed inside of the particle beam column 3. It is possible, however, to dispose outside of the particle beam column 3 and inside of the vacuum chamber 11 in addition to said detector or as an alternative to said detector one or more detectors such that the at least one detector detects particles emanating from the sample 7.

The total pressure in the vacuum chamber 11 may be in a range of $10^{-5}$ mbar to $10^{-7}$ mbar during detection of a microscopic image.

The microscopy system 1 exemplified here further has a supply system 31 for a process gas for directing the process gas to a zone close to the sample 7. The supply system 31 comprises a reservoir 33 which may contain the process gas in form of a liquid 34, for example. The process gas may flow into a conductor 37 via a valve 35 controlled by the controller 25 via a control line 36, wherein the conductor 37 penetrates a wall 39 of the vacuum chamber 11 and has an exit end 38 close to the sample 7. The process gas leaving the exit end 38 of the conductor 37 may be activated by the particle beam 5 such that material can be deposited at the sample 7 or ablated from the sample 7. Process gases for deposition of material are given by, for example:

tungsten hexacarbonyl $W(CO)_6$ for deposition of tungsten,
(Trimethyl)methylcyclopentadienyl-platinum(IV)
$C_5H_4CH_3Pt(CH_3)_3$ for deposition of platinum,
2,4,6,8,10-Pentamethylcyclopentasiloxane (PMCPS)
$(CH_3SiHO)_5$ for deposition of silicon dioxide $SiO_2$.

Examples for possible process gases for ablation of material are given by:
- xenon difluoride $XeF_2$ for ablation of silicon Si,
- magnesium sulfate heptahydrate $MgSO_4 \times 7H_2O$ or water vapor $H_2O$ for ablation of carbon C.

With some of these materials it may be helpful to use an ion beam for activation. In this case, the particle beam column may be an ion beam column. It is also possible to use a system comprising both, an electron beam column and an ion beam column, wherein the beams of both columns may in particular be directed to a common target destination on the sample.

It is further possible to supply a process gas to the sample in order to reduce an electrical charge-up of the sample due to an irradiation by the particle beam.

Evacuation of the vacuum chamber 11 takes place via a pumping system 41 comprising a high vacuum pump 45, like for example a turbo molecular pump, connected directly to the vacuum chamber 11 via a flange 43 and a backing pump 47, like for example a piston pump, connected to the high vacuum pump 45. A vacuum gate valve 49 is disposed between the high vacuum pump 45 and the vacuum chamber 11, wherein the vacuum gate valve 49 allows for pumping out of the vacuum chamber 11 via high vacuum pump 45 when the vacuum gate valve 49 is in an opening position and further blocks pumping out of the vacuum chamber 11 via high vacuum pump 45 when the vacuum gate valve 49 is in a closing position. The vacuum gate valve 49 is controlled via a control line 50 by the controller 25. Furthermore, the vacuum system of the microscopy system 1 has one or more vacuum meter 51 to measure the pressure inside of the vacuum chamber 11. Measured vacuum data are read out via a control line 52 by the controller 25.

The particle beam column 3 comprises one or more pump ports 55 which are configured to be connected separately to a vacuum pumping system (not shown in FIG. 1) in order to evacuate the interior of the particle beam column 3 independently from the vacuum chamber 11.

During operation of the particle system 1 for detecting microscopic images or equally during operation of the system 31 for ablation of material from or for deposition of material on the sample via process gas 34, there are reaction products formed which can be deposited on the wall of the vacuum chamber 11, on the surface of the sample 7 itself or on portions of the particle beam column 3. Other contaminants in the vacuum chamber 11 can be formed when, for example, oils from the pumping system 41 enter the vacuum chamber 11.

Such contaminants may perturb further operation of the particle beam system 1. In order to remove these contaminants, the particle beam system 1 comprises a supply system 61 for a precursor gas. The precursor gas may be converted into a reaction gas via irradiation of electromagnetic radiation, the precursor gas forming bonds with the contaminants or decomposing the contaminants such that the contaminants desorb from the surfaces and may be removed from the vacuum chamber 11 via the pumping system 41. In the example described here, the precursor gas is oxygen, which is retained in a reservoir 63, as for example a pressure bottle, outside of the vacuum chamber 11. The reservoir 63 is locked by a valve 65 which can be opened in order to supply the precursor gas to the interior of the vacuum chamber 11 via a conductor 67. The valve 65 is controlled via a control line 68 by the controller 25.

The particle beam system 1 comprises one or more sources 71 of electromagnetic radiation in order to activate the precursor gas inside of the vacuum chamber 11 and in the vicinity of the surface on which contaminants are deposited. The electromagnetic radiation for activating oxygen as the precursor gas is ultraviolet radiation having a significant spectral portion of wavelengths shorter than 300 nm or even shorter than 200 nm as exemplified here. The sources of radiation 71 may be mercury vapor lamps. The sources of radiation 71 are disposed in the vacuum chamber 11. Light emitted by the sources of radiation 71 impinges directly or indirectly onto surfaces of the vacuum chamber 11, the sample holder 9, the particle beam column 3 and/or the sample 7 via light conducting and light directing elements, as for example mirror 73. Beams of light generated by the sources of radiation 71 and directed onto the surfaces are denoted by reference numeral 72 in FIG. 1. The irradiation of said surfaces by the energy-rich radiation causes excitation of the contaminants and/or conversion of precursor gas into reaction gas in close vicinity of the surfaces. The reaction gas can react with the contaminants adsorbed to the surfaces such that these contaminants are finally converted into kinds of contaminants that desorb from the surfaces.

The sources of radiation 71 are connected to electric supply lines 74 which are also controlled by the controller 25.

In order to execute a cleaning of surfaces, the controller 25 supplies precursor gas to the vacuum chamber 11 by opening the valve 65 such that the partial pressure of the precursor gas in the vacuum chamber 11 is augmented significantly compared to the normal operation of the particle beam system 1, in which cleaning is not executed. During a cleaning process, the partial pressure of the precursor gas is in a range from 100 mbar to 2000 mbar. In this case, the controller 25 activates the sources of radiation 71 in order to emit the electromagnetic radiation, which converts the precursor gas into reaction gas in a vicinity of the irradiated walls and which activates contaminants, such that the cleaning process can take place by reaction of the contaminants with the reaction gas and/or decomposition of the contaminants via the reaction gas.

Such a cleaning process may take some (2) minutes or up to several (8) hours depending on the process and the type of contaminant. The precursor gas may be supplied continuously during the process and the vacuum chamber 11 may be pumped out continuously by the pumping system 41. It is also possible, however, that the controller 25 decouples the pumping system 41 via the vacuum gate valve 49 from the vacuum chamber 11, opens the valve 65 to supply precursor gas and measures the gas pressure in the vacuum chamber 11 via the vacuum meter 51. The controller 25 can close the valve 65 to prevent further supply of precursor gas when the measurement results in the pressure reaching a desired value. Then, the exposure of the surfaces to the electromagnetic radiation can be conducted for a certain time, as for example 10 minutes, in operating the source of radiation 71 to obtain a partial cleaning. Then, the controller 25 can open the vacuum gate valve 49 to evacuate the vacuum chamber 11 and to discharge the reaction products of the contaminants. The process can then be repeated once more in closing the vacuum gate valve 49, opening the valve 65 until a desired pressure is obtained and again irradiating the surfaces.

One of the mirrors 73 is held pivotably by a joint 82 such that an orientation of the mirror 73 may be changed via an actuator 83, as shown in FIG. 1. For that reason, the mirror 73 may be pivoted to vary the location the radiation beam 72 impinges onto the component to be irradiated and, thus, to clean relatively widely extending surfaces of different components by radiation beam 72.

Figure 2:
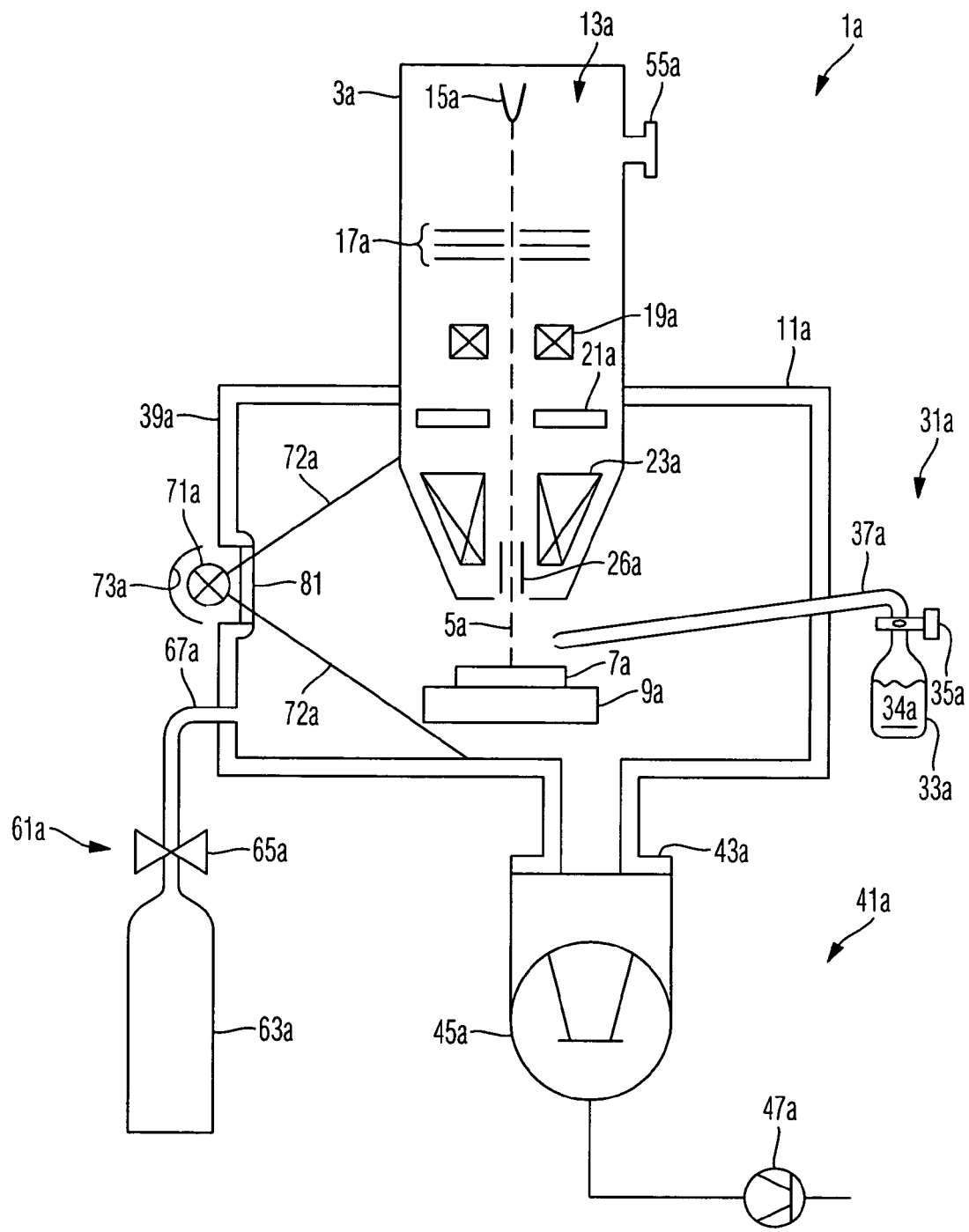
FIG. 2 shows a particle beam microscopy system according to a second embodiment.

A further embodiment of a particle beam system 1a is shown schematically in FIG. 2. The particle beam system 1a has a similar structure as the one explained with reference to FIG. 1, from which it differs by the structure of an irradiation system to irradiate contaminated surfaces by electromagnetic radiation. A source of radiation 71 is not disposed inside of a vacuum chamber 11a in the particle beam system 1a, but the source of radiation 71a is disposed outside of the vacuum chamber 11a close to a window 81 in a wall 39a of the vacuum chamber 11a such that radiation 72a emitted from the source of radiation 71a may enter through the window 81 into the vacuum chamber 11a and may irradiate surfaces of the wall 39a of the vacuum chamber 11a, surfaces of a particle beam column 3a, surfaces of a sample holder 9a and, if applicable, surfaces of sample 7a held by a sample holder 9a. A cleaning process of the surfaces may in turn be carried out, in that a precursor gas from a supply 63a is directed into the interior of the vacuum chamber 11a to build up an augmented partial pressure of the precursor gas. The precursor gas is converted to reaction gas in a vicinity of the irradiated surfaces by the effect of the electromagnetic radiation or the contaminants being activated at the surface in order to reduce contaminants adsorbed to the surfaces.

Figure 3:
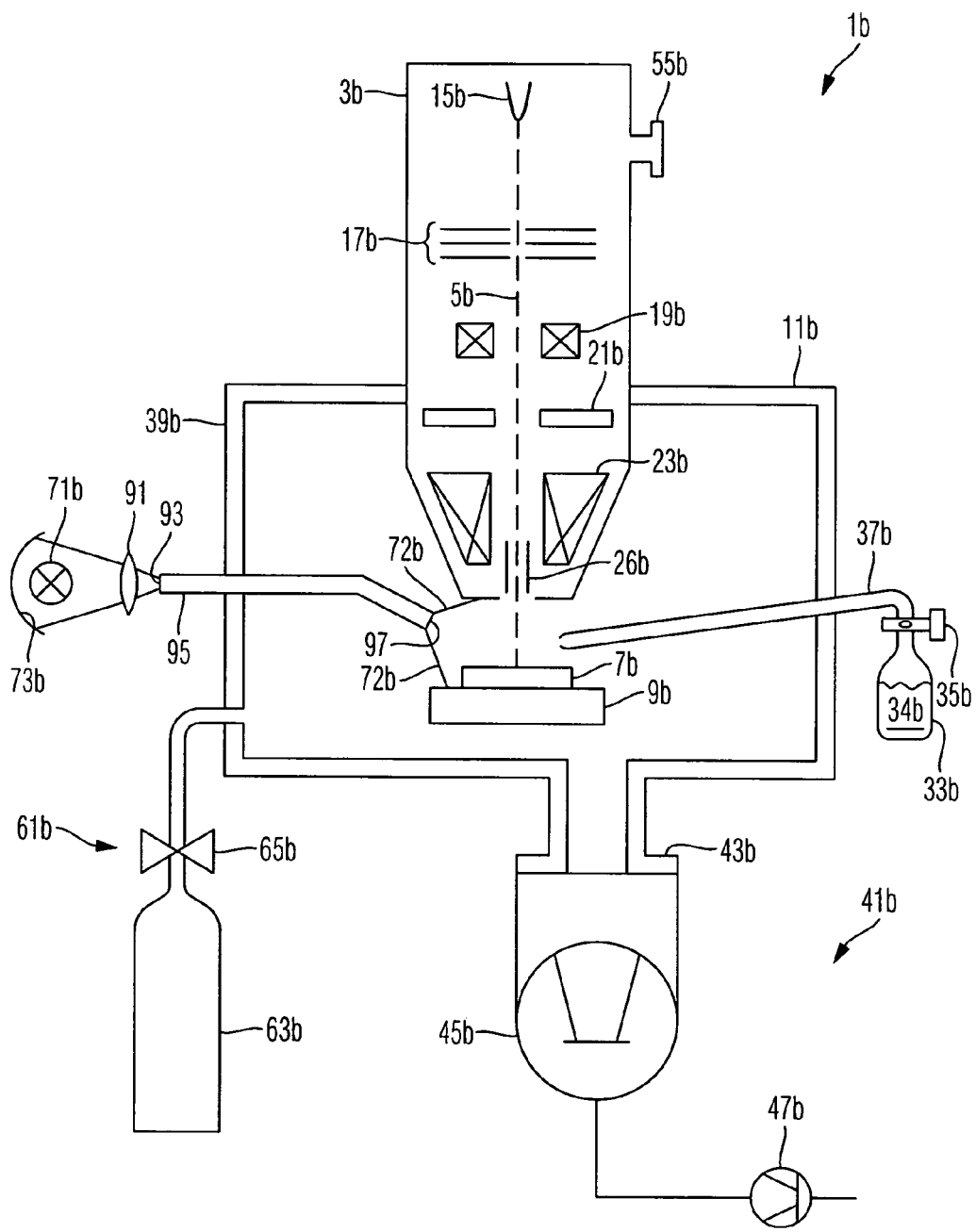
FIG. 3 shows a particle beam microscopy system according to a third embodiment.

In another embodiment, a particle beam system 1b is represented schematically in FIG. 3. This particle beam system 1b differs from the embodiments explained above by a structure of an irradiation system irradiating contaminated surfaces by electromagnetic radiation. The irradiation system of the particle beam system 1b comprises a source of radiation 71b disposed outside of a vacuum chamber 11b and which emits electromagnetic radiation collimated onto an input end 93 of an optical fiber 95 by one or more lenses 91 in order to couple radiation emitted by the source of radiation 71b into the optical fiber 95.

The optical fiber 95 may comprise a glass fiber bundle. The optical fiber 95 penetrates a wall 39b of the vacuum chamber 11b and extends into the vacuum chamber 11b to the vicinity of a sample holder 9b, on which there may be a sample 7b to be inspected disposed. At an exit end 97 of the optical fiber 95 the radiation coupled into the optical fiber 95 leaves the same as beam 72b and irradiates portions of surfaces of the sample holder 9b of a particle beam system 1b and of the sample 7b, if applicable. It is also possible to direct via the optical fiber 95 radiation onto surfaces of other components on which contaminants may be deposited in order to clean said surfaces. A cleaning process of the particle beam system 1b may be carried out as explained above with reference to the other embodiments. In particular, the precursor gas is directed from a reservoir 63b into the interior of the vacuum chamber 11b in order to build up there an augmented partial pressure of precursor gas. The contaminants are activated via irradiation of the surfaces to be cleaned by electromagnetic radiation or a precursor gas is converted into a reaction gas in the vicinity of the surfaces and may react with the contaminants adsorbed to the surfaces such that the contaminants desorb from the surfaces and in the end may be removed from the vacuum chamber 11b by pumping out.

Various possible structures for the at least one source of radiation relative to the remaining components of the particle beam system were explained in the precedingly described embodiments. It is also possible, however, to provide several sources of radiation in a particle beam system, wherein one or more sources of radiation are disposed in the vacuum chamber and wherein one or more additional sources of radiation are disposed outside of the vacuum chamber. The latter may be in turn disposed such that light emitted by said sources of radiation enter the vacuum chamber via a window or are directed into the vacuum chamber via optical fibers towards the surfaces to be cleaned.

In the embodiment explained with reference to FIG. 3, an actuator may also be provided in order to displace the end 97 of the optical fiber relative to the components to be irradiated in order to vary the location at which the beam of emitted radiation impinges the surfaces of the components.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A method of operating a particle beam microscopy system, the method comprising:
   supplying a precursor gas to a vacuum chamber of the particle beam microscopy system, wherein a sample holder is configured to hold a sample in a vacuum chamber;
   directing electromagnetic radiation onto surfaces of at least one of components of the particle beam microscopy system, a sample held by the sample holder, and the sample holder, wherein the electromagnetic radiation is generated by a source of radiation arranged outside of the vacuum chamber;
   transforming the precursor gas near the surfaces into a reaction gas reacting with contaminants present on the surfaces;
   directing a particle beam onto the sample; and
   detecting particles emanating from the sample.

2. The method according to claim 1, wherein the electromagnetic radiation enters into the vacuum chamber through a window.

3. The method according to claim 1, wherein the electromagnetic radiation is guided to the vicinity of the sample holder by a light guide.

4. A method of operating a particle beam microscopy system, the method comprising:
   supplying a precursor gas to a vacuum chamber of the particle beam microscopy system, wherein a sample holder is configured to hold a sample in a vacuum chamber;
   directing electromagnetic radiation onto surfaces of at least one of components of the particle beam microscopy system, a sample held by the sample holder, and the sample holder, wherein positions of incidence of the electromagnetic radiation onto the surfaces are varied with an actuator;
   transforming the precursor gas near the surfaces into a reaction gas reacting with contaminants present on the surfaces;
   directing a particle beam onto the sample; and
   detecting particles emanating from the sample.

5. A particle beam microscopy system, comprising:
   a vacuum chamber including a chamber wall;
   a vacuum pumping system for generating a vacuum in the vacuum chamber;
   a particle beam column including components arranged therein and configured to generate a particle beam directed onto a sample;
   a sample holder configured to hold a sample in the vacuum chamber;
   a detector for detecting particles emanating from the sample;
   at least one source of electromagnetic radiation; and
   a system for supplying a precursor gas into the vacuum chamber, further comprising one of the group consisting of a window for transmitting the electromagnetic radiation into the vacuum chamber from the outside thereof, and a light guide for guiding the electromagnetic radiation to the vicinity of the sample holder, wherein the at least one source of electromagnetic radiation is arranged relative to the vacuum chamber such that radiation emitted by the at least one source of electromagnetic radiation is incident on surfaces of components of the particle beam microscopy system and is not incident on the components arranged within the particle beam column.

6. The particle beam microscopy system according to claim 5, further comprising a gas supply for supplying a reaction gas to a vicinity of the sample holder.

7. The particle beam microscopy system according to claim 6, configured to perform a method comprising:
supplying a precursor gas to the vacuum chamber such that a partial pressure of the precursor gas in the vacuum chamber is at least 10 mbar;
directing electromagnetic radiation onto surfaces of at least one of components of the particle beam microscopy system, a sample held by the sample holder, and the sample holder;
transforming the precursor gas near the surfaces into a reaction gas reacting with contaminants present on the surfaces;
directing a particle beam onto the sample; and
detecting particles emanating from the sample.

8. A particle beam microscopy system, comprising:
a vacuum chamber including a chamber wall;
a vacuum pumping system for generating a vacuum in the vacuum chamber;
a particle beam column including components arranged therein and configured to generate a particle beam directed onto a sample;
a sample holder configured to hold a sample in the vacuum chamber;
a detector for detecting particles emanating from the sample;
at least one source of electromagnetic radiation; and
a system for supplying a precursor gas into the vacuum chamber,
further comprising one of the group consisting of a window for transmitting the electromagnetic radiation into the vacuum chamber from the outside thereof, and a light guide for guiding the electromagnetic radiation to the vicinity of the sample holder, wherein the at least one source of electromagnetic radiation is arranged relative to the vacuum chamber such that radiation emitted by the at least one source of electromagnetic radiation is incident on electrically conductive surfaces.

9. The particle beam microscopy system according to claim 8, further comprising a gas supply for supplying a reaction gas to a vicinity of the sample holder.

10. The particle beam microscopy system according to claim 9, configured to perform a method comprising:
supplying a precursor gas to the vacuum chamber such that a partial pressure of the precursor gas in the vacuum chamber is at least 10 mbar, wherein a sample holder is configured to hold a sample in a vacuum chamber;
directing electromagnetic radiation onto surfaces of at least one of components of the particle beam microscopy system, a sample held by the sample holder, and the sample holder;
transforming the precursor gas near the surfaces into a reaction gas reacting with contaminants present on the surfaces;
directing a particle beam onto the sample; and
detecting particles emanating from the sample.

11. A particle beam microscopy system, comprising:
a vacuum chamber including a chamber wall;
a vacuum pumping system for generating a vacuum in the vacuum chamber;
a particle beam column including components arranged therein and configured to generate a particle beam directed onto a sample;
a sample holder configured to hold a sample in the vacuum chamber;
a detector for detecting particles emanating from the sample;
at least one source of electromagnetic radiation; and
a system for supplying a precursor gas into the vacuum chamber,
further comprising one of the group consisting of a window for transmitting the electromagnetic radiation into the vacuum chamber from the outside thereof, and a light guide for guiding the electromagnetic radiation to the vicinity of the sample holder.

12. A particle beam microscopy system, comprising:
a vacuum chamber including a chamber wall;
a vacuum pumping system for generating a vacuum in the vacuum chamber;
a particle beam column including components arranged therein and configured to generate a particle beam directed onto a sample;
a sample holder configured to hold a sample in the vacuum chamber;
a detector for detecting particles emanating from the sample;
a system for supplying a precursor gas into the vacuum chamber, and
at least one source of UV radiation arranged in the vacuum chamber so that UV radiation emitted from the at least one source of UV radiation is incident on surfaces of components of the particle beam microscopy system, the at least one source of UV radiation being connected to electric supply lines.

13. The particle beam microscopy system according to claim 12, wherein the system for
supplying a precursor gas into the vacuum chamber is configured to supply the precursor gas in a manner to achieve a partial pressure of the precursor gas in the vacuum chamber of at least 10 mbar.

14. The particle beam microscopy system according to claim 13, wherein the system for supplying the precursor gas is configured to supply the precursor gas in a manner to achieve a partial pressure of the precursor gas in the vacuum chamber between 100 mbar and 2000 mbar.

15. The particle beam microscopy system according to claim 14, wherein the system for supplying a precursor gas into the vacuum chamber is configured to supply one of oxygen, oxygen-containing gases and oxygen-containing vapors.

16. The particle beam microscopy system according to claim 12, wherein the surfaces, onto which the UV radiation is directed, include at least one of the sample holder and the detector of the particle beam microscopy system.

17. The particle beam microscopy system according to claim 12, further comprising a valve provided in the system for supplying a precursor gas, and a controller, wherein the controller is configured to control the valve and the vacuum pumping system to maintain the partial pressure of the precursor gas in the vacuum chamber between 100 mbar and 2000 mbar.

18. The particle beam microscopy system according to claim 17, wherein the at least one source of UV radiation is arranged relative to the vacuum chamber such that UV radiation emitted by the at least one source of UV radiation is incident on the sample holder.

19. The particle beam microscopy system according to claim 18, wherein the system for supplying a precursor gas into the vacuum chamber is configured for supplying one of oxygen, oxygen-containing gases and oxygen-containing vapors.

20. The particle beam microscopy system according to claim 12, wherein the components of the particle beam microscopy system onto which the UV radiation is incident, comprise the sample holder and the detector.

21. The particle beam microscopy system according to claim 12, wherein the at least one source of UV radiation is arranged relative to the vacuum chamber such that UV radiation emitted by the at least one source of UV radiation is incident on surfaces of components of the particle beam microscopy system and is not incident on the components arranged within the particle beam column.

22. The particle beam microscopy system according to claim 12, wherein the system for supplying a precursor gas into the vacuum chamber is configured for supplying the precursor gas to a vicinity of the sample holder.

23. The particle beam microscopy system according to claim 12, wherein the at least one source of UV radiation is arranged relative to the vacuum chamber such that UV radiation emitted by the at least one source of UV radiation is incident on electrically conductive surfaces.

24. The particle beam microscopy system according to claim 22, wherein the at least one source of UV radiation is arranged relative to the vacuum chamber such that UV radiation emitted by the at least one source of UV radiation is incident on electrically conductive surfaces.

* * * * *